United States Patent

Mizuno et al.

[11] Patent Number: 6,011,416
[45] Date of Patent: Jan. 4, 2000

[54] SWITCH CIRCUIT HAVING EXCESS-CURRENT DETECTION FUNCTION

[75] Inventors: Fumiaki Mizuno; Takashi Hoshino; Motonori Kido; Yoshiyuki Miyazaki, all of Nagoya, Japan

[73] Assignees: Harness System Technologies Research Ltd., Nagoya; Sumitomo Wiring Systems, Ltd., Mie; Sumitomo Electric Industries, Ltd., Osaka, all of Japan

[21] Appl. No.: 08/974,604

[22] Filed: Nov. 19, 1997

[30] Foreign Application Priority Data

Feb. 19, 1997 [JP] Japan ..................................... 9-035083

[51] Int. Cl.[7] ............................. H02H 3/08; H02H 3/027
[52] U.S. Cl. ......................... 327/108; 327/321; 327/434; 361/96; 361/98
[58] Field of Search ................................. 361/93, 94, 95, 361/96, 97, 98, 100, 101, 18, 54, 57; 327/108, 109, 110, 198, 321, 434, 77; 323/277; 307/116, 130, 131

[56] References Cited

U.S. PATENT DOCUMENTS

| | | | |
|---|---|---|---|
| 4,893,211 | 1/1990 | Bynum et al. | 361/18 |
| 4,979,066 | 12/1990 | Kawata et al. | 361/18 |
| 5,289,043 | 2/1994 | Marshall et al. | 307/38 |
| 5,304,935 | 4/1994 | Rathke et al. | 361/101 |
| 5,394,287 | 2/1995 | Sakata et al. | 361/98 |
| 5,510,950 | 4/1996 | Bills et al. | 361/93 |
| 5,563,759 | 10/1996 | Nadd | 361/101 |
| 5,774,321 | 6/1998 | Kim et al. | 361/94 |
| 5,786,970 | 7/1998 | Nao et al. | 361/18 |
| 5,898,557 | 4/1999 | Baba et al. | 361/103 |

FOREIGN PATENT DOCUMENTS

B2-8-14598  2/1996  Japan ........................... G01R 31/00

Primary Examiner—Timothy P. Callahan
Assistant Examiner—Terry L. Englund
Attorney, Agent, or Firm—Oliff & Berridge, PLC

[57] ABSTRACT

A microcomputer 4 responds to an instruction signal to turn the load L on or off to control the FET 2 through the drive circuit 5. The microcomputer 4 samples an electric current $I_L$ which is supplied through the A/D converter 6 and which flows in the load L at every predetermined sampling time $T_S$ and subjects the sampled electric current $I_L$ to a comparison with a known rated current value $I_R$ for the load L. When $I_L \geq I_R$ is satisfied, the microcomputer 4 starts counting energizing time T. When the accumulated value of $I_L \times T_S$ is enlarged to a predetermined value $S_O$, the microcomputer 4 turns the FET 2 off. When the detected electric current $I_L$ is larger than an upper limit $I_O$ ($>I_R$) determined previously, the microcomputer 4 immediately turns the FET 2 off through the drive circuit 5.

6 Claims, 9 Drawing Sheets

① FOURTH CURRENT MONITORING CIRCUIT 414
   FIFTH CURRENT MONITORING CIRCUIT 415

② FOURTH CURRENT MONITORING CIRCUIT 414
   FIFTH CURRENT MONITORING CIRCUIT 415

③ SECOND CURRENT MONITORING CIRCUIT 412
   THIRD CURRENT MONITORING CIRCUIT 413
   FOURTH CURRENT MONITORING CIRCUIT 414
   FIFTH CURRENT MONITORING CIRCUIT 415

④ FIRST CURRENT MONITORING CIRCUIT 411
   SECOND CURRENT MONITORING CIRCUIT 412
   THIRD CURRENT MONITORING CIRCUIT 413
   FOURTH CURRENT MONITORING CIRCUIT 414
   FIFTH CURRENT MONITORING CIRCUIT 415

SWITCH CIRCUIT HAVING EXCESS-CURRENT DETECTION FUNCTION

BACKGROUND OF THE INVENTION

1. Field of the Invention

The present invention relates to a switch circuit having an excess-current detection function for on/off-control supply of electric power from a power source to a load.

2. Description of the Related Art (1) Prevention of a short circuit of an electric circuit which causes a failure of an apparatus and a fire has a critical problem which has been investigated to be solved for a long time. However, various states of the short circuits have inhibited a countermeasure capable of appropriately operating against any state of the short circuits and having a simple structure from being realized.

Hitherto, fuses have been most widely employed to protect the equipment and electrical lines from a short circuit. The fuse is provided with a metal conductor portion and arranged in such a manner that the metal conductor portion is melted when the temperature of the metal conductor portion has been raised to a level higher than a predetermined level. In general, the fuse is disposed at an intermediate position of the electric line which must be protected, for example, a power supply line connected to a load in such a manner that the fuse is in series connected to the power source. When an excess current flows in the fuse and thus the temperature of the metal conductor portion is raised to a level higher than the foregoing set level, the metal conductor portion is melted so that supply of electric power through the electric line, which must be protected, is interrupted.

(2) On the other hand, miniaturization of electric products has been attempted by reducing the size of electronic elements arranged to be mounted on the electric product. For example, a switch circuit has been employed in which a switching device for controlling supply of electric power from the power source to a load and a control circuit for controlling the operation of the switching device are integrally mounted on a substrate. As a switch circuit of the foregoing type, there has been employed a circuit having a protective circuit arranged to, in addition to simple on-off control of the switching device, detect generation of abnormality, such as an excess current, excess voltage, overheat and the like, and to control the switching device in response to detection of the abnormality.

The conventional technique (1) is required to design the above-mentioned set value in consideration of deleting with respect to the environment temperatures because the heat accumulation ratio is lowered and melting time is elongated when the environment temperature is low because the metal conductor portion has been melted by accumulated heat.

The short circuits include a state in which an excess current flows continuously and a state in which pulse-like excess currents intermittently flow. In the latter case, the heat accumulation ratio is reduced as compared with the former case. Therefore, there arises apprehension that the melting time is elongated or the fuse cannot be melted though an excess current is flowing. Thus, devices and electric lines cannot reliably be protected by using the fuse from intermittent pulse-like excess currents.

The switch circuit in the conventional technique (2) is arranged to detect an excess current in such a manner that the switching device is immediately switched off when an electric current having a level considerably higher than a rated current for the circuit or the load has flowed so as to self-protect the switch circuit. That is, the foregoing technique is not structured to protect the electric line and the load from an excess current having a level somewhat higher than that of the rated current set for the electric-line elements between the power source and the load or that for the load.

SUMMARY OF THE INVENTION

To solve the above-mentioned problems, an object of the present invention is to provide a switch circuit having an excess-current detection function which is capable of reliably protecting the electric lines and the load.

According to the present invention, there is provided a switch circuit having an excess-current detection function, including a semiconductor switching device disposed between a load and a power source and arranged to turn on or off the connection between the load and the power source in accordance with a control signal supplied to a control terminal thereof and switch control means arranged to receive an instruction signal output from an instruction-signal output portion and to output a control signal to the control terminal of the semiconductor switching device so as to control supply of electric power from the power source to the load, comprising: electric-current detection means for detecting a load electric current which flows in the load; and excess-current control means for changing on/off control of the semiconductor switching device when detection of the load electric current satisfies an excess current determining condition previously determined in accordance with the electric characteristics of the electric line between the load and the power source or those of the load.

The above-mentioned structure is arranged in such a manner that when the instruction signal output from the instruction-signal output portion and instructing the operation of the load is received, the control signal is output to the control terminal of the semiconductor switching device in accordance with the received instruction signal so that the connection between the load and the power source is turned on or off in accordance with the control signal. When the load electric current flowing in the load is detected and the detected load electric current satisfies the excess current determining condition determined previously in accordance with the electric characteristics of the electric line between the load and the power source or those of the load, on-off control of the semiconductor switching device is changed. Thus, passage of an excess current larger than the electric characteristics of the electric line between the load and the power source or those of the load can be prevented.

The present invention may be structured in such a manner that the semiconductor switching device, the switch control means and the excess-current control means are integrally formed on a substrate.

The above-mentioned structure, in which the semiconductor switching device, the switch control means and the excess-current control means are integrally formed on the substrate, enables the size of the circuit to be reduced and the electric wiring to be simplified.

The present invention may be structured in such a manner that the electric-current detection means is furthermore integrally formed on the substrate.

Since the above-mentioned structure is arranged in such a way that also the electric-current detection means is integrally formed on the substrate in addition to the semiconductor switching device, the switch control means and the excess-current control means, the size of the circuit can furthermore be reduced and the electrical wiring can be simplified.

The present invention may be structured in such a manner that the excess-current control means has comparison means for subjecting the detected load electric current and a reference electric current determined previously in accordance with the electric characteristics to a comparison and count means for counting energizing time in which an electric current larger than the reference electric current flows in the load, and the excess current determining condition is determined by using the load electric current larger than the reference electric current and the energizing time.

The above-mentioned structure is arranged in such a manner that the load electric current, which flows in the load, is detected and the detected load electric current and the reference electric current determined previously in accordance with the electric characteristics of the electric line or the load are subjected to a comparison. Then, the energizing time is counted in which an electric current larger than the reference electric current flows is counted. If a load electric current larger than the reference electric current and the energizing time satisfy the excess current determining condition, on-off control of the semiconductor switching device is changed so as to reliably prevent occurrence of an undesirable fact that the energizing time of the excess current exceeds the electric characteristics of the electric line between the load and the power source or those of the load. The reference electric current may be the rated current for the electric line or the load.

The excess-current control means is arranged to determine an excess current when a condition is satisfied such that a predetermined electric current larger than the reference electric current flows in the load for time determined previously in accordance with the electric characteristics and provided with a plurality of excess current determining conditions obtained by combining different set electric currents and set time periods arranged in such a manner that the set time is shortened in inverse proportion to the set electric current, the comparison means further subjects the detected load electric current and each of the set electric currents to a comparison, and the count means further counts energizing time in which an electric current larger than each of the set electric current flows in the load.

The foregoing structures are arranged in such a manner that the load electric current, which flows in the load, is detected, the detected load electric current, the reference electric current and each set electric current are subjected to a comparison, and the energizing time is counted in which an electric current larger than the reference electric current and each set electric current flows in the load. Since the set time is made to be shorter in inverse proportion to the set electric current, the larger the electric current, which flows in the load, as compared with the reference electric current, the shorter the time in which an excess current is determined. Thus, the determination of the excess current can precisely be performed. Thus, supply of electric power by a degree exceeding the electric characteristics of the electric line or the load can reliably be prevented.

The excess-current control means may have calculating means for obtaining the product of an electric current, which flows in the load in each predetermined time and which is larger than the reference electric current and the above-mentioned set time so as to accumulate the products and determining means for determining an excess current when the value of the accumulation is enlarged to a predetermined value. The foregoing structure enables determination of an excess current to be performed in short energizing time if the level of the load electric current is low and determination of an excess current to be performed in long energizing time if the level of the load electric current is low. As a result, the determination of the excess current can precisely be performed. Thus, supply of electric power by a degree exceeding the electric characteristics of the electric line or the load can reliably be prevented.

The excess-current control means turns the semiconductor switching device off when the excess current determining condition is satisfied.

The foregoing structure is arranged in such a manner that when the instruction signal indicating the operation of the load is received from the instruction-signal output portion, the control signal is output to the control terminal of the semiconductor switching device. In response to the control signal, the connection between the load and the power source is on-off controlled. When a load electric current, which flows in the load, has been detected and the detected load electric current satisfies the excess current determining condition determined previously in accordance with the electric characteristics of the electric line between the load and the power source or those of the load, the semiconductor switching device is switched off. Thus, supply of an excess current exceeding the electric characteristics of the electric line between the load and the power source or the load can be prevented.

The excess-current control means has storage means for storing the reference electric current determined previously in accordance with the electric characteristics and comparison means for subjecting the detected load electric current and the reference electric current to a comparison to determine an excess current when the detected load electric current is larger than the reference electric current.

The above-mentioned structure is arranged in such a manner that the reference electric current determined previously in accordance with the electric characteristics of the electric line between the load and the power source or the load and the detected load electric current are subjected to a comparison to determine an excess current if the load electric current is larger than the reference electric current. As a result, the semiconductor switching device is switched off even in an intermittent short circuit state, which is not a complete short circuit state. Thus, supply of an excess current exceeding the electric characteristics of the electric line between the load and the power source or the load can reliably be prevented.

The storage means further stores a high-level reference electric current higher than the reference electric current and a predetermined set time, and the excess-current control means is further provided with count means for counting a lapse of time from time at which the semiconductor switching device has been switched on by the switch control means to determine an excess current when the load electric current is larger than the high-level reference electric current in a state where the lapse of time is shorter than the set time and to determine an excess current when the load electric current is larger than the reference electric current in a state where the lapse of time is longer than the set time.

The above-mentioned structure is arranged in such a manner that the lapse of time from the moment at which the semiconductor switching device has been switched on is counted. When the load electric current is larger than the high-level reference electric current, an excess current is determined until predetermined set time elapses from time at which the semiconductor switching device has been switched on. After the set time has elapsed from the time at which the semiconductor switching device has been switched on, an excess current is determined if the load electric current is larger than the reference electric current. Thus, even with a load, in which a rush current flows when it is turned on, the rush current is not erroneously determined to be an excess current.

The storage means further stores a low-level reference electric current smaller than the reference electric current and the excess-current control means further determines abnormality when the load electric current is smaller than the low-level reference electric current in a state where the lapse of time is longer than the set time.

The above-mentioned structure is arranged in such a manner that a determination to be abnormal is made when the load electric current is smaller than the low-level reference electric current after the set time has elapsed from the moment at which the semiconductor switching device has been switched on. As a result, even if an abnormal state is realized in which intermittent opening takes place, the semiconductor switching device is switched off. Thus, supply of electric power in an abnormal state can reliably be prevented.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the present invention with reference to the accompanying drawings.

Figure 1:
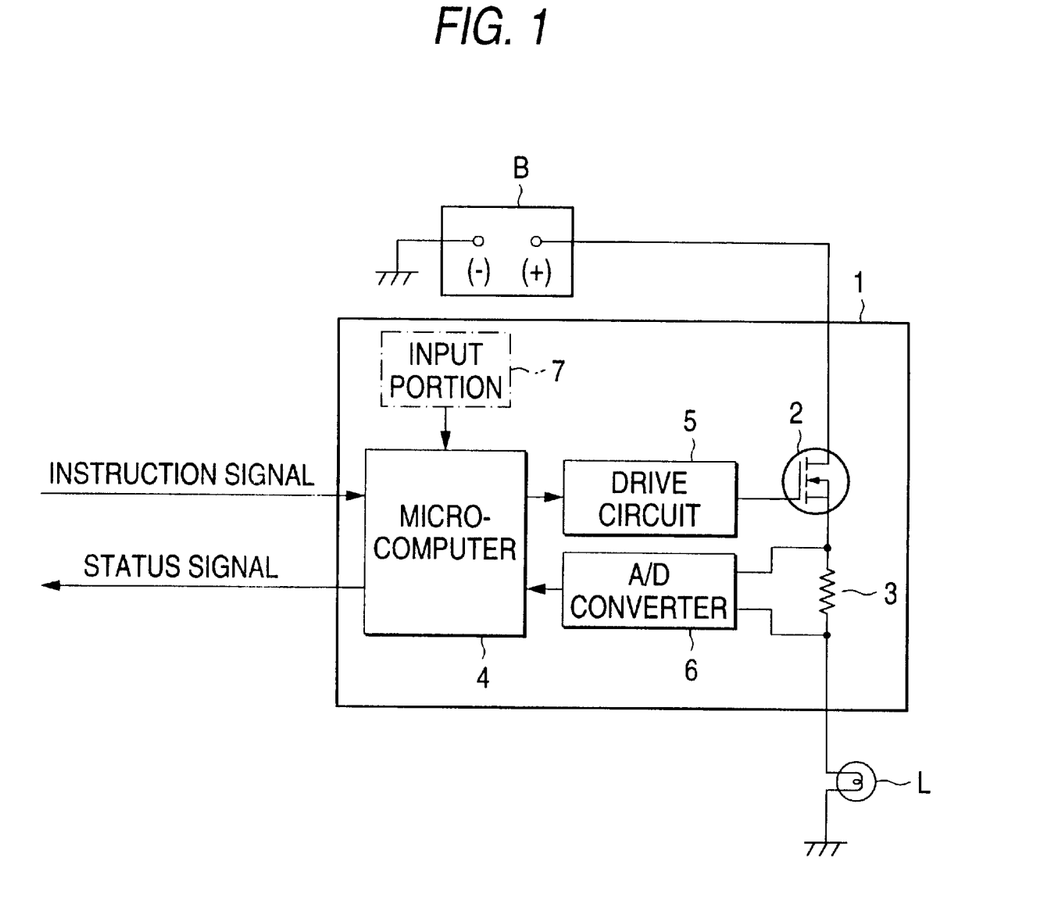
FIG. 1 is a circuit block diagram showing a first embodiment of a switch circuit having an excess-current detection function according to the present invention.

FIG. 1 is a circuit block diagram showing a first embodiment of a switch circuit having an excess-current detection function according to the present invention.

The switch circuit 1 having an excess-current detection function forms a lamp control circuit for an automobile for controlling supply of electric power from a battery (a power source) B to a lamp (a load) L and comprises a N-channel field-effect transistor (hereinafter called an "FET") 2, a shunt resistor (a current detection portion) 3, a microcomputer 4, a drive circuit 5 and an A/D converter 6. The foregoing elements are integrally formed on a substrate, such as a printed circuit board or a semiconductor board. Note that the substrate having the foregoing elements mounted thereon may be molded by synthetic resin or the like.

The FET 2 and the shunt resistor 3 are in series connected between the battery B and the lamp L in such a manner that the drain of the FET 2 is connected to the positive pole of the battery B, the source of the same is connected to the shunt resistor 3 and the gate of the same is connected to the drive circuit 5. When the FET 2 has been turned on, an electric current flows in the lamp L through the shunt resistor 3.

The shunt resistor 3 in a low-level resistor for converting an electric current into voltage. By detecting voltages at the two ends of the shunt resistor 3, an electric current which flows in the lamp L can be detected. The shunt resistor 3 enables the electric current to accurately be detected and rapid change in the electric current to be detected. The A/D converter 6 is arranged to convert an analog value of the two end voltages of the shunt resistor 3 into a digital value so as to supply the digital value to the microcomputer 4.

The microcomputer 4 responds to an instruction signal supplied from outside to control the FET 2 to be turned on or off through the drive circuit 5 so as to control the lamp L to be turned on or off. The drive circuit 5 comprises a charge pump for raising the voltage level of the control signal supplied from the microcomputer 4 to follow the control signal supplied from the microcomputer 4 to apply a gate signal to the FET 2 to turn the FET 2 on or off.

The microcomputer 4 samples an electric current $I_L$ which is supplied through the A/D converter 6 and which flows in the lamp L at every predetermined sampling time $T_S$ (1 second in this embodiment) and subjects the sampled electric current $I_L$ to a comparison with a known rated current value $I_R$ for the lamp L. When $I_L \geq I_R$ is satisfied, the microcomputer 4 starts counting the energizing time T. When the accumulated value of $I_L \times T_S$ is enlarged to a predetermined value $S_0$, the microcomputer 4 turns the FET 2 off.

When the detected electric current $I_L$ is larger than an upper limit $I_O$ ($>I_R$) determined previously, the microcomputer 4 immediately turns the FET 2 off through the drive circuit 5. When the microcomputer 4 has turned the FET 2 off because of detection of an excess current, the microcomputer 4 outputs a status signal indicating this.

Figure 2:
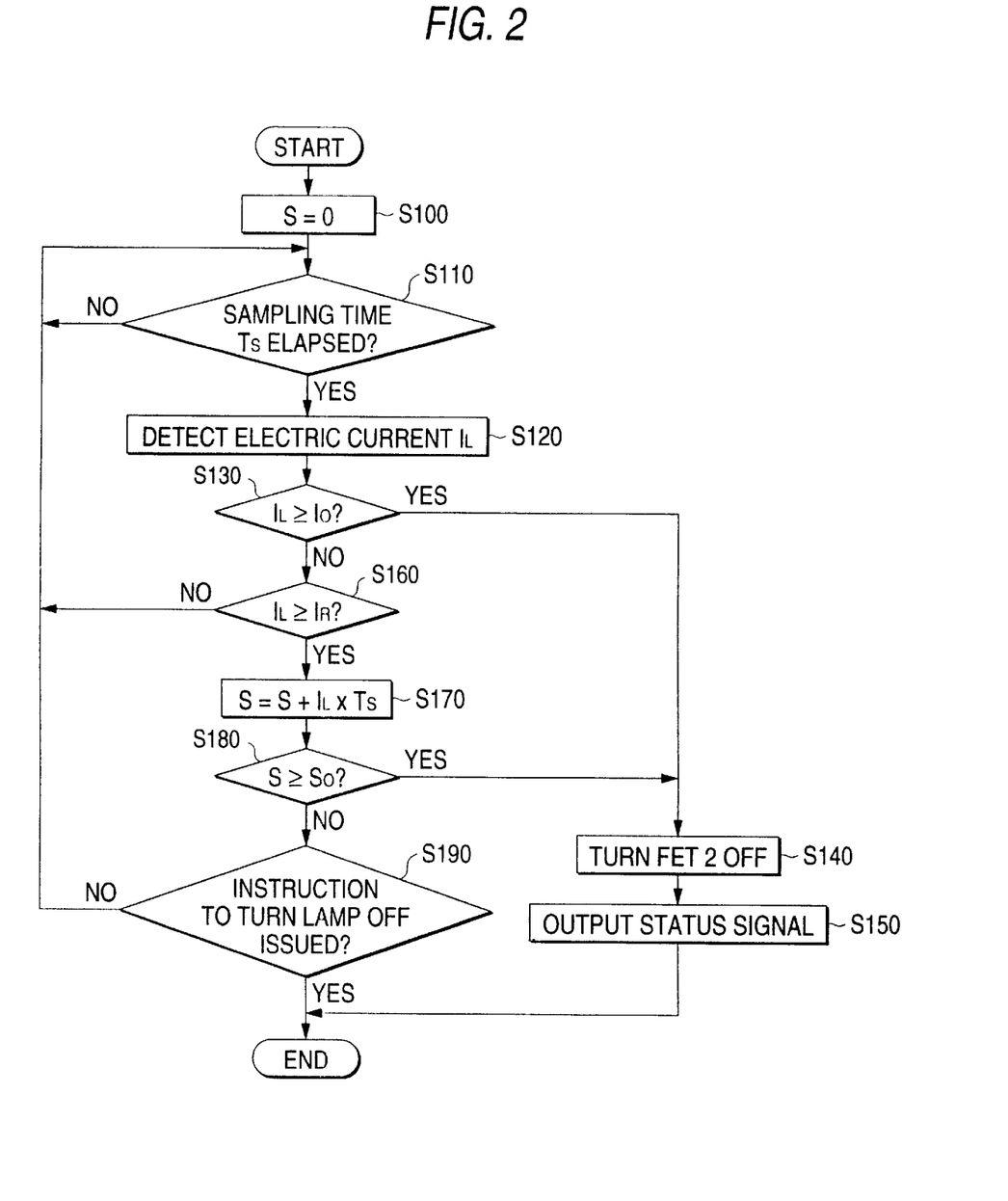
FIG. 2 is a flow chart of a procedure for detecting an excess current.

FIG. 2 is a flow chart of a procedure for detecting an excess current.

When a signal to instruct the lamp L to be turned on has been supplied, the operation of this routine is commenced. Initially, a memory register S is set to be 0 (step S100). When the sampling time $T_S$ has elapsed (YES in step S110), an electric current $I_L$ is sampled from the A/D converter 6 (step S120).

Then, whether or not $I_L \geq I_O$ is determined (step S130). If $I_L \geq I_O$ (YES in stop S130), the FET 2 is immediately turned off (step S140) so that the status signal is output (step S150) and this routine is ended.

If $I_L < I_O$ (NO in step S130), whether or not $I_L \geq I_R$ is determined (step S160). If $I_L < I_R$ (NO in step S160), the operation returns to step S110.

If $I_L \geq I_R$ in step S160 (YES in step S160), the product of the electric current $I_L$ and the energizing time $T_S$ is, in the form of $S=S+I_L \times T_S$, accumulated in the memory register S (step S170). Then, whether or not $S \geq S_0$ is determined (step S180).

If $S \geq S_0$ (YES in step S180), the operation proceeds to step S140. If $S<S_0$ (NO in step S180), whether or not an instruction signal to turn the lamp L off has been supplied is determined (step S190). If the instruction signal for turning off the same has been supplied (YES in step S190), the foregoing routine is ended.

If the instruction signal for turning the lamp L off has not been issued (NO in step S190), the operation returns to step S110 so that the foregoing operation is repeated at every Sampling time $T_S$.

As described above, the FET 2 is turned off to interrupt supply of electric power to the lamp L when the accumulated value of the product $I_L \times T_S$ with the energizing time $T_S$ has reached the predetermined value $S_0$ in a state where an excess current $I_L$ larger than the rated electric current $I_R$ flows. Therefore, when the level of the excess current $I_L$ is low, supply of electric power to the lamp L is interrupted after electric power has been supplied for a relatively long time. If the level of the excess current $I_L$ is high, supply of electric power to the lamp L is interrupted after electric power has been supplied for a short time. As a result, supply interruption control can be performed to be adaptable to the level of the excess current. Moreover, when an excess current flows, the supply interruption control can be performed to be adaptable to the current resistance characteristic of the lamp L.

Figure 3:
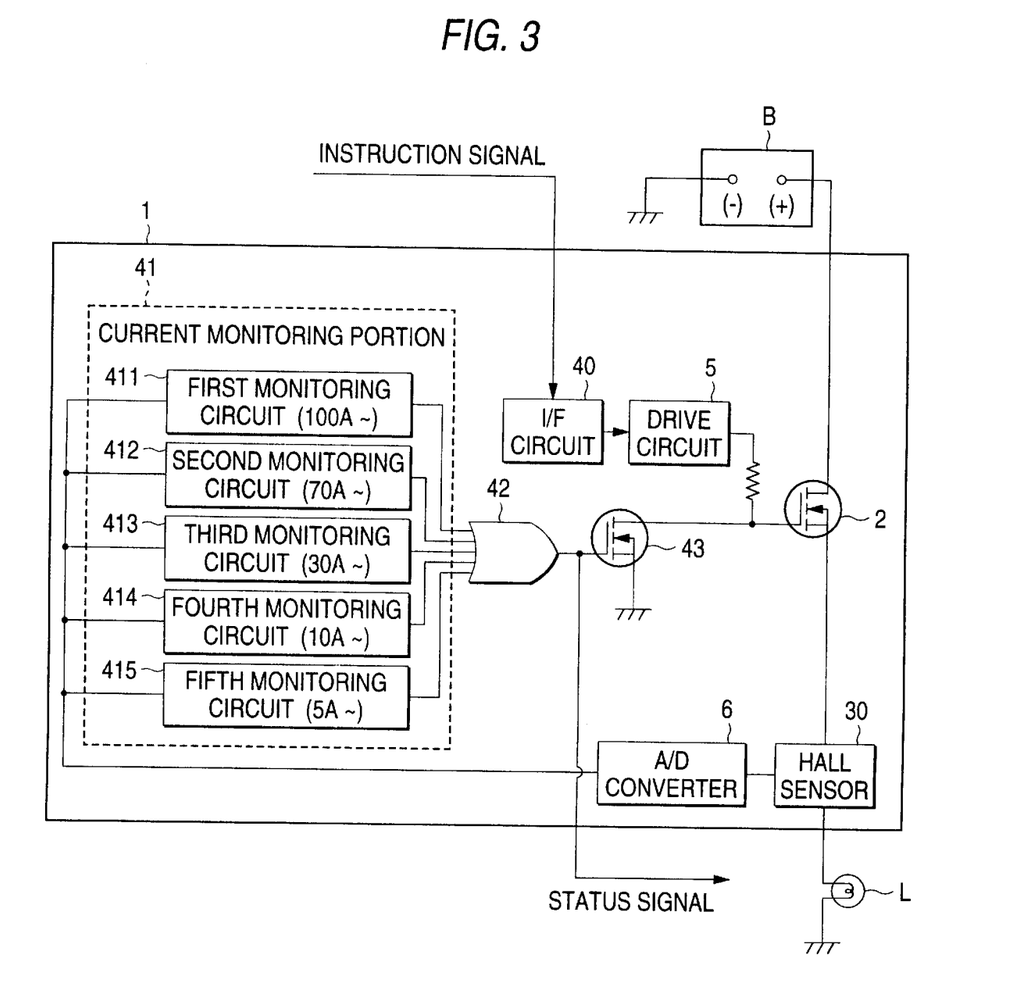
FIG. 3 is a circuit block diagram showing a second embodiment of the switch circuit having an excess-current detection function according to the present invention.

FIG. 3 is a circuit block diagram showing a second embodiment of the switch circuit having an excess-current detection function according to the present invention. The same elements an those according to the first embodiment are given the same reference numerals and the same elements are omitted from description.

In the second embodiment, the switch circuit 1 having an excess-current detection function is provided with a hall sensor (the current detection portion) 30 as an alternative to the shunt resistor 3. Moreover, an interface (I/F) circuit 40, a current monitoring portion 41, an OR gate circuit 42 and an FET 43 are provided as an alternative to the microcomputer 4. Similarly to the first embodiment, the foregoing elements are integrally fomed on a printed circuit substrate or a semiconductor substrate. Note that the rated current $I_R$ for the lamp L is 5 A.

The hall sensor 30 comprises a semiconductor device arranged to use a hall effect which outputs voltage V which is in proportion to the product $I \times B$ of electric current I which flows in the semiconductor device and the magnetic flux density B when the semiconductor device is placed in a magnetic field having the magnetic flux density B. In accordance with the level of the output voltage V, the electric current $I_L$ which flows in the lamp L can be detected The hall sensor 30 enables the electric current to accurately be detected though the size of the apparatus is very small.

The I/F circuit 40 receives an instruction signal supplied from outside to instruct the lamp L to be turned on or off and controls the FET 2 to turn on or off through the drive circuit 5 in accordance with the instruction signal so as to control the lamp L to be turned on or off.

The current monitoring portion 41 has first to fifth monitoring circuits 411 to 415 each comprising a comparator and an on-delay timer and having an output connected to the input of the OR gate circuit 42. The output of the OR gate circuit 42 is connected to the gate of the FET 43, the drain of the FET 43 is connected to the gate of the FET 2, and the source of the FET 43 is connected to an earth line.

The first to fifth monitoring circuits 411 to 415 are arranged to sample the electric current $I_L$ supplied through the A/D converter 6 at every predetermined sampling time $T_S$ (1 second in this embodiment) to output high level signals in accordance with the level of the electric current. When an electric current $I_L$ larger than 100 A has been supplied, the first monitoring circuit 411 starts the operation thereof so as to immediately output the high level signal.

The second monitoring circuit 412 starts the operation thereof when an electric current $I_L$ larger than 70 A is supplied thereto. If the supply of the foregoing electric current is continued for 5 seconds, the second monitoring circuit 412 outputs a high-level signal. The third monitoring circuit 413 starts the operation thereof when an electric current $I_L$ larger than 30 A is supplied thereto. If the supply of the foregoing electric current is continued for 10 seconds, the third monitoring circuit 413 outputs a high-level signal. The fourth monitoring circuit 414 starts the operation thereof when an electric current $I_L$ larger than 10 A is supplied thereto. If the supply of the foregoing electric current is continued for 30 seconds, the fourth monitoring circuit 414 outputs a high-level signal. The fifth monitoring circuit 415 starts the operation thereof when an electric current $I_L$ larger than 5 A is supplied thereto. If the supply of the foregoing electric current is continued for 60 seconds, the fifth monitoring circuit 415 outputs a high-level signal.

If the high-level signal is output from at least one of the first to fifth monitoring circuits 411 to 415, a high-level signal is output from the OR gate circuit 42 to the gate of the FET 43. As a result, the FET 43 is turned on so that the gate potential of the FET 2 is lowered to cause the FET 2 to be turned off. Thus, supply of electric power to the lamp L is interrupted.

The following Table 1 shown conditions under which the lamp L is interrupted by the current monitoring portion 41. As shown in Table 1, each of the first to fifth monitoring circuits 411 to 415 interrupts supply of electric power to the lamp L in accordance with the level of the electric current $I_L$ which flows in the lamp L.

TABLE 1

| DETECTED ELECTRIC CURRENT $I_L(A)$ | ENERGIZING TIME TO INTERRUPTION |
|---|---|
| $100 \leq I_L$ | Immediately |
| $70 \leq I_L < 100$ | 5 seconds |
| $30 \leq I_L < 70$ | 10 seconds |
| $10 \leq I_L < 30$ | 30 seconds |
| $5 \leq I_L < 10$ | 60 seconds |

Figure 4:
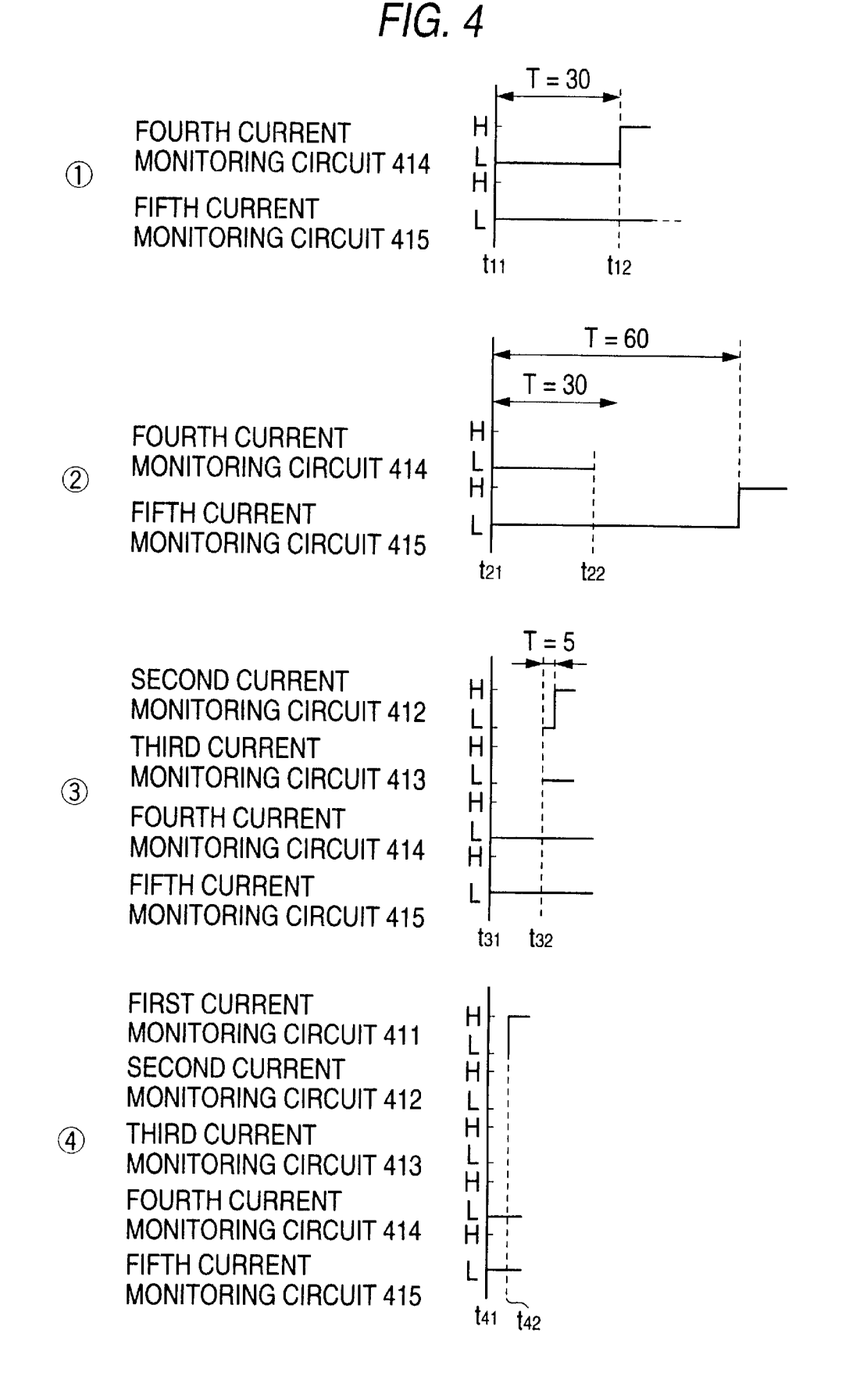
FIG. 4 is a timing chart showing operation examples (1) to (4)

With reference to a timing chart shown in FIG. 4, operation examples (1) to (4) will now be described.

(1) When a 15 A electric current $I_L$ has been detected at time $t_{11}$, the fourth monitoring circuit 414 and the fifth monitoring circuit 415 start the operations thereof. If an electric current $I_L$ of 10 A or larger and smaller than 30 A flows for 30 seconds, a high-level signal is transmitted from the fourth monitoring circuit 414 to the OR gate circuit 42 at time $t_{12}$. Therefore, a high-level signal is transmitted from the OR gate circuit 42 to the gate of the FET 43. As a result, the FET 43 is electrically conducted, thus causing the gate potential of the FET 2 to be lowered. Thus, the FET 2 is turned off so that supply of electric power to the lamp L is interrupted.

(2) When the detected electric current $I_L$ has been enlarged to 15 A at time $t_{12}$, the fourth monitoring circuit 414 and the fifth monitoring circuit 415 start the operations thereof. When the detected electric current $I_L$ has been made to be smaller than 10 A (not smaller than 5 A) at time $t_{22}$ which is shorter than 30 seconds from time $t_{21}$, the operation of the fourth monitoring circuit 414 is interrupted and the operation of the fifth monitoring circuit 415 is continued. If an electric current $I_L$ not smaller than 5 A flows for 60 seconds from time $t_{21}$, the high-level signal is transmitted from the fifth monitoring circuit 415 to the OR gate circuit 42 at time $t_{22}$. Therefore, the high-level signal is output from the OR gate circuit 42 to the gate of the FET 43. As a result, the FET 43 is electrically conducted so that the gate potential of the FET 2 is lowered and the FET 2 is turned off. Thus, supply of electric power to the lamp L is interrupted.

(3) When an electric current $I_L$ of 10 A or larger and smaller than 30 A starts flowing at time $t_{31}$, the fourth monitoring circuit 414 and the fifth monitoring circuit 415 start the operations thereof. When the detected electric current $I_L$ has been made to be 85 A at time $t_{32}$ which is shorter than 30 seconds from time $t_{31}$, the second monitoring circuit 412 and the third monitoring circuit 413 start the operations thereof. If a state is realized in which the detected electric current $I_L$ is 70 A or larger and smaller than 100 A for 5 seconds from time $t_{32}$, the second monitoring circuit 412 transmits a high-level signal to the OR gate circuit 42. An a result, the FET 43 is electrically conducted so that the gate potential of the FET 2 is lowered. Thus, the FET 2 is turned off and supply of electric power to the lamp L is interrupted.

(4) When a 50 A electric current $I_L$ starts flowing at time $t_{41}$, the third monitoring circuit 413 to the fifth monitoring circuit 415 start the operations thereof. If the detected electric current $I_L$ exceeds 100 A at time $t_{42}$ which is shorter than 10 seconds from time $t_{41}$, a high-level signal is immediately transmitted from the first monitoring circuit 411 to the OR gate circuit 42. As a result, the FET 43 is electrically conducted so that the gate potential of the FET 2 is lowered. As a result, the supply of electric power to the lamp L is interrupted.

When a determination is made that the detected electric current $I_L$ which flows in the lamp L is an excess current, the FET 2 is turned off as described above. Therefore, supply of electric power to the lamp L can automatically be interrupted. Since the level of the electric current $I_L$ is detected and the FET 2 is arranged to be turned off in a short energizing time as the level of the excess current is raised, supply of electric power exceeding the current resistance for the lamp L can reliably be interrupted.

The present invention is not limited to the first and second embodiments. The following modifications (1) to (10) may be employed.

(1) The structure of the first embodiment may be arranged in such a manner that an input portion 7 comprising a dip switch and the like as indicated by an alternate long and short dash line shown in FIG. 1 is provided to permit the microcomputer 4 to arbitrarily set rated current value $I_R$, set values $S_0$ and $_O$ and the like in response to input to the input portion 7.

(2) As compared with the first embodiment in which the FET 2 is turned off when an excess current has been detected, a PWM control signal having a predetermined duty ratio may be output from the microcomputer 4 to the drive circuit 5 to turn the FET 2 on or off with a predetermined switching frequency so as to reduce the electric current to be supplied to the lamp L. Note that a preferred switching frequency of the PWM control signal is 100 Hz or higher. By using the FET 2 to serve as the switching device, the FET 2 can reliably be turned on and off.

(3) In the first and second embodiments, the N-channel field effect transistor is employed to serve as the semiconductor switching device. A bipolar transistor, a P-channel FET or an insulation gate type bipolar transistor (IGBT), may be employed. Also in this case, the electric current to be supplied to the lamp L can be reduced by turning the transistor on or off by using the PWM control signal similarly to the modification (2).

(4) In the second embodiment, the current monitoring portion 41 has five current monitoring circuits, the number of the current monitoring circuits may be reduced. The number of the current monitoring circuits may be enlarged to enlarge the number of combinations of the current levels, to be determined, and energizing time periods taken to the interruption so as to oat interruption characteristic S, as shown in FIG. 5.

Figure 5:
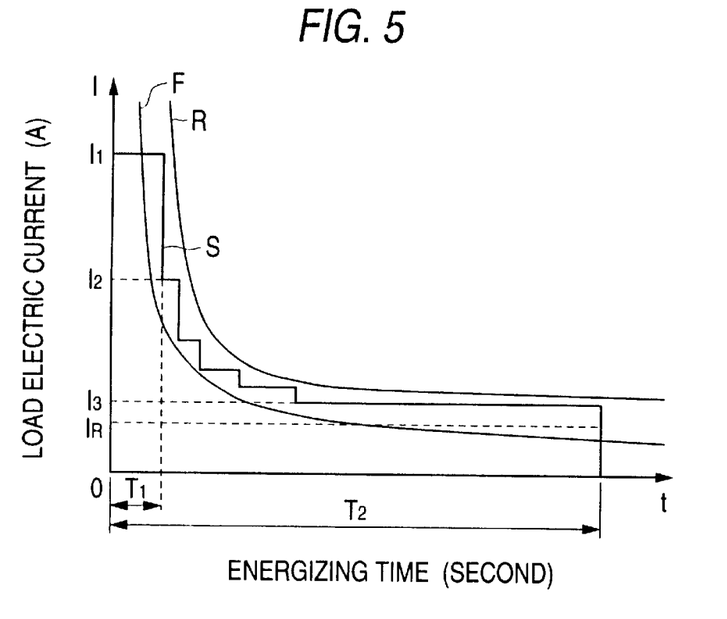
FIG. 5 is a graph showing a lamp interruption characteristic according to modification (4)

FIG. 5 shows the interruption characteristic S of the lamp L according to the modification (4), in which fusing characteristic R indicating an electric current level which causes the load or the electric-line elements to fuse is additionally shown. Moreover, fuse melting characteristic F is shown as a comparative example. Note that the rated electric current for the lamp L is $I_R$.

In the case shown in FIG. 5, when detected electric current $I_L$ satisfies $I_1 \leq I_L$, supply of electric power is immediately interrupted. When $I_2 \leq I_L < I_1$ is satisfied, interruption is performed at energizing time $T_1$. When $I_R \leq I_L < I_3$, interruption is performed at energizing time $T_2$.

When the interruption characteristic S for the lamp L is set as shown in FIG. 5, approach to the fusing characteristic R of the load and the electric-line elements can be realized as compared with the melting characteristic F of the fuse. That is, the rated electric current for the electric-line elements can be lowered to the electric current level which is actually supplied. Thus, the diameter of the electric lines for use in the electric-line elements can be reduced. As a result, the weight and cost of the elements can be reduced.

(5) The structures according to the first embodiment or the second embodiment may be arranged in such a manner that notification means, having a display portion comprising an LCD panel or the like for notifying a user of interruption of supply of electric power attributable to an excess current in response to a status signal output from the switch circuit 1 having an excess-current detection function to the outside, may be attached to a position on the outside of the switch circuit 1 having an excess-current detection function. As a result, interruption of supply of an electric current attributable to an excess current can reliably be communicated to the user.

(6) The structure according to the first embodiment or the second embodiment may be arranged in such a manner that the current detection portion may be composed of a resistor in series connected between the FET 2 and the lamp L and a temperature sensor for detecting the temperature of the resistor as an alternative to the shunt resistor 3 and the hall sensor 30. In the foregoing case, the microcomputer 4 is arranged to monitor change in the electric current by detecting change in the temperature of the resistor so that a similar effect is obtained with a simple structure.

(7) The current detection portion may be formed by using a direct-current transformer method in which two coils wound in the opposite directions are disposed through which an electric line connected from the battery B to the lamp L and which must be measured passes. Moreover, an alternating-current power source for applying alternating-current voltage to one of the coils is provided. In addition, a detection portion is provided which detects an alternating current induced by the other coil when the alternating-current voltage has been applied. Since the alternating current is in proportion to the electric current which flows through the electric line which must be measured, the electric current which flows in the lamp L can be detected.

As a result, the current detection portion can be insulated from the electric line which must be measured. When the winding ratio of the coil is adjusted, the output level can be raised to a required level. In the foregoing case, a portion or the overall body of the current detection portion may be disposed on the outside of the substrate on which the elements are mounted.

(8) The current detection portion may be formed by using the alternating-current transformer method. The foregoing method is arranged in such a manner that an electric line, which establishes the connection between the battery B and the lamp L and which must be measured, is disposed to penetrate the coil or magnetically coupled with the coil. Moreover, a detection portion is provided so that an alternating current which is induced by the coil attributable to change in the electric current, such as a rush current into the lamp L, is detected. Since the differential waveform of the rush current into the lamp L is detected in the above-mentioned case, provision of a current monitoring portion for identifying the level of the excess current in accordance with the change ratio of the waveform of the electric current enables the excess current to be determined.

(9) The first and the second embodiments may be arranged in such a manner that an excess-voltage detection portion and a temperature detection portion integrally formed on the substrate of the switch circuit 1 having an excess-current detection function may be provided. The excess voltage detection portion is connected to a power supply line extending from the battery B to detect whether or not excess voltage exists. The temperature detection portion comprises a thermistor to detect the environmental temperature so as to detect whether or not overheating has taken place.

(10) Although the first and second embodiments have been described which has the structure in which the structure of the present invention is applied to a switch circuit for controlling the lamp which is the load, the present invention may be applied to a switch circuit for controlling a load, such as a motor without the lamp to turn the load on and off.

Figure 6:
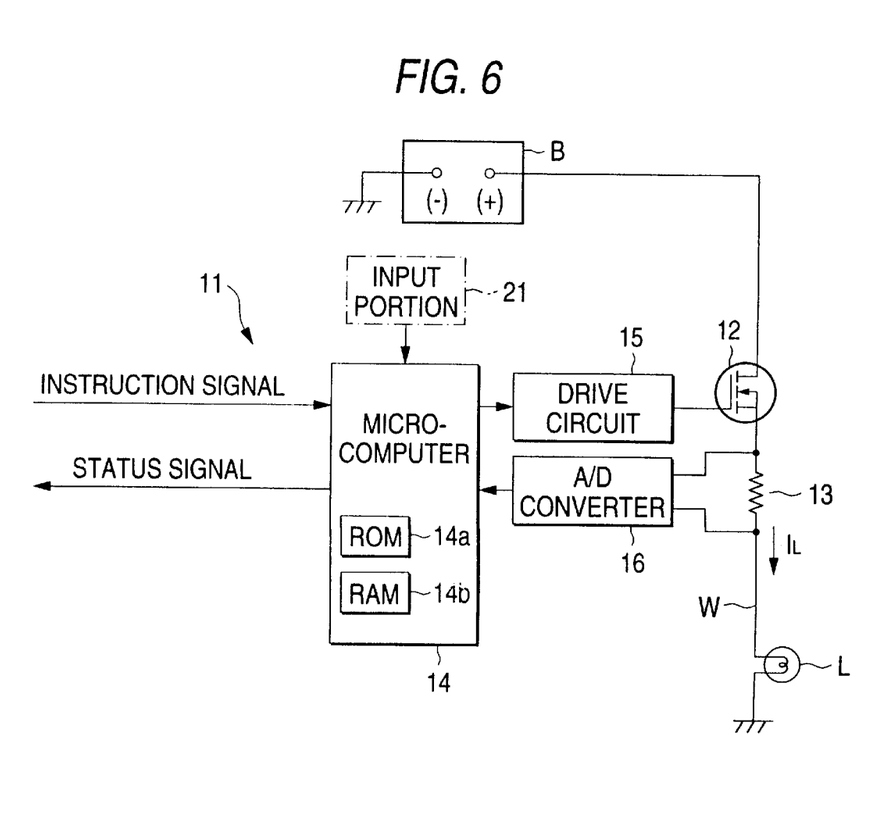
FIG. 6 is a circuit block diagram showing a third embodiment of the switch circuit having an excess-current detection function according to the present invention.

A third embodiment of the present invention will now be described. FIG. 6 is a circuit block diagram showing a third embodiment of the switch circuit having an excess-current detection function according to the present invention.

A switch circuit 11 having an excess-current detection function forms a lamp control circuit for controlling supply of electric power from a battery (a power source) B of an automobile to a lamp (a load) L and comprises an FET 12, a shunt resistor (a current detection portion) 13, a microcomputer 14, a drive circuit 15 and an A/D converter 16.

The FET 12 and the shunt resistor 13 are in series connected between the battery B and the lamp L in such a manner that the drain of the FET 12 is connected to the positive pole of the battery B, the source of the same is connected to an end of the shunt resistor 13, the gate is connected to an output terminal of the microcomputer 14 through the drive circuit 15 and another end of the shunt resistor 13 is grounded through an electric line W and the lamp L. As a result of the above-mentioned structure, when the FET 12 has been turned on, electric power is supplied from the battery B to the lamp L through the shunt resistor 13 and the electric line W.

The shunt resistor 13 is a low-level resistor for converting an electric current into voltage. By detecting the voltages at the two ends of the shunt resistor 13, a load electric current $I_L$ which flows in the lamp L can be detected. The shunt resistor 13 enables an electric current to accurately be detected and rapid change in the electric current to be detected. When the shunt resistor 13 has a low degree of temperature dependency, the current detection accuracy with respect to change in the atmospheric temperature can be improved.

The A/D converter 16 is arranged to convert an analog value of the two-end voltage of the shunt resistor 13 into a digital value so as to supply the digital value to the microcomputer 14. The drive circuit 15 comprises a charge pump for raising the voltage level of a control signal supplied from the microcomputer 14 to supply a gate signal to the FET 12 in accordance with the control signal supplied from the microcomputer 14 to turn the FET 12 on or off.

The microcomputer 14 includes a ROM 14a and a RAM 14b so as to control the operation of the lamp control circuit. The RAM 14b temporarily stores data, while the ROM 14a stores predetermined set values, such as set time $T_1$ and reference electric currents $I_1$, $I_2$ and $I_3$ and a control program.

The set time T1 is determined in consideration of a duration of a rush current which flows when the lamp L has been turned on. The reference electric current $I_1$, and $I_2$ ($I_1>I_2$) are determined in consideration of the current resistance characteristic (for example, the fusing characteristic of the coating for the electric wire) of the electric line W, while the reference electric current $I_3$ is determined to be a value required to satisfy $0<I_3<I_2$.

The microcomputer 14 has the following functions (A) to (F).

(A) In response to an instruction signal supplied from outside and arranged to turn the lamp L on or off, the microcomputer 14 controls the FET 12 through the drive circuit 15 to turn the FET 12 on or off so as to control the operation of the lamp L.

(B) The microcomputer 14 has a function to serve as a time measuring means for counting time lapse T from time at which the FET 12 has been switched on.

(C) The microcomputer 14 samples a value supplied from the A/D converter 16 at every predetermined sampling time $T_S$ (100 msec in this embodiment) to detect a load electric current $I_L$ which flows in the lamp L.

(D) The microcomputer 14 has functions to serve as comparison means for subjecting the detected load electric current $I_L$ and reference electric currents $I_1$, $I_2$ and $I_3$ stored in the 14a to a comparison and excess-current determining means for determining whether or not the electric current is an excess current in accordance with a result of the comparison.

In the foregoing case, when time lapse T is shorter than set time $T_1$, the load electric current $I_L$ is subjected to a comparison with the reference electric current $I_1$. If $I_L \geq I_1$ is satisfied, the electric current is determined to be an excess current.

If the time lapse T is set time $T_1$ or longer, comparison with the reference electric currents $I_2$ and $I_3$ is performed. If $I_L \geq I_2$, the electric current is determined to be an excess current. If $I_L \leq I_3$, the electric current is determined to be an excess current.

If $I_L \leq I_3$, the electric current is not necessarily an excess current. In this case, the load electric current is determined to be in an abnormal state because it has been lowered from a steady level to a level not higher than the reference electric current $I_3$.

(E) The microcomputer 14 has a function to serve as excess-current control means for turning the FET 12 off through the drive circuit 15 when it has determined the electric current is an excess current or that the same is in an abnormal state.

(F) When the FET 12 has been turned off because of a determination made such that the electric current is an excess current or the same is in an abnormal state, the microcomputer 14 outputs a status signal indicating this.

Figure 7:
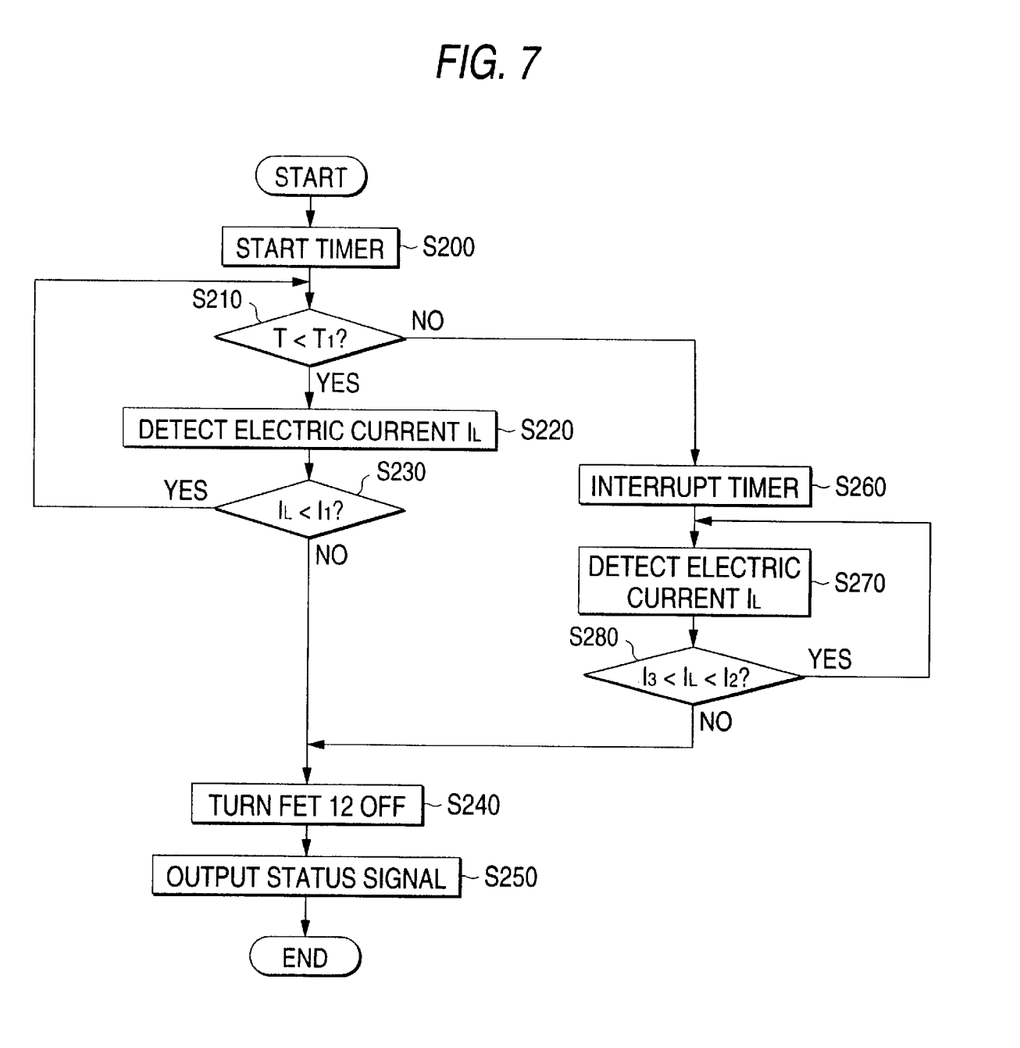
FIG. 7 is a flow chart of a procedure for determining an excess current according to the third embodiment.
Figure 8:
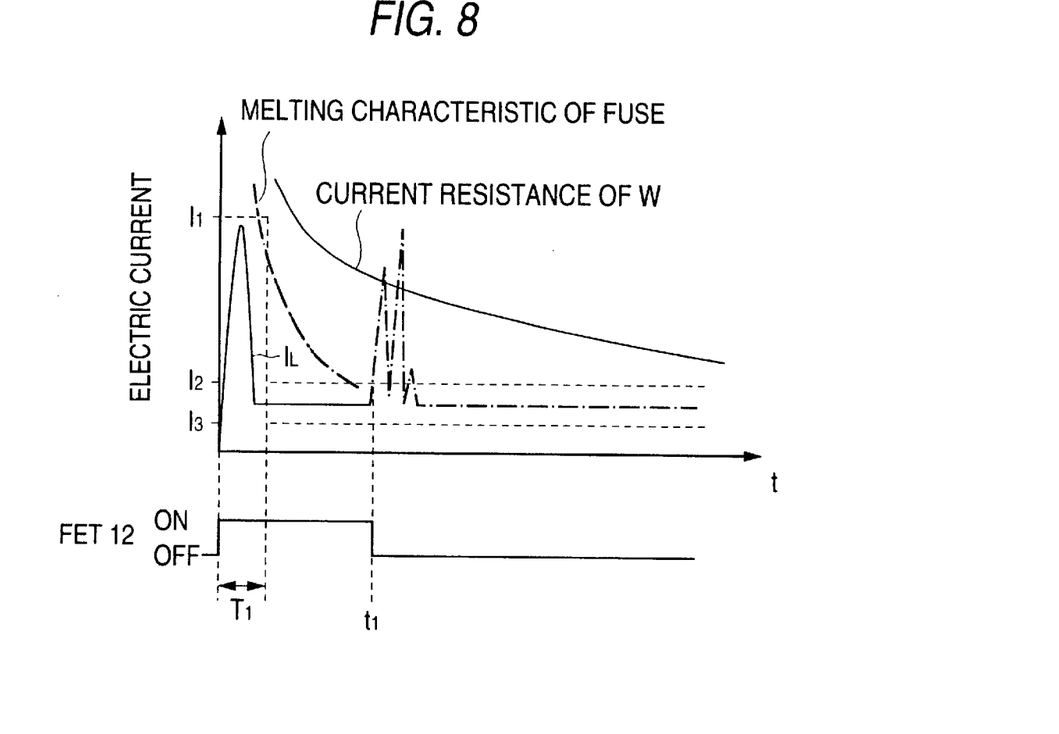
FIG. 8 is a graph showing an example of an abnormal state.
Figure 9:
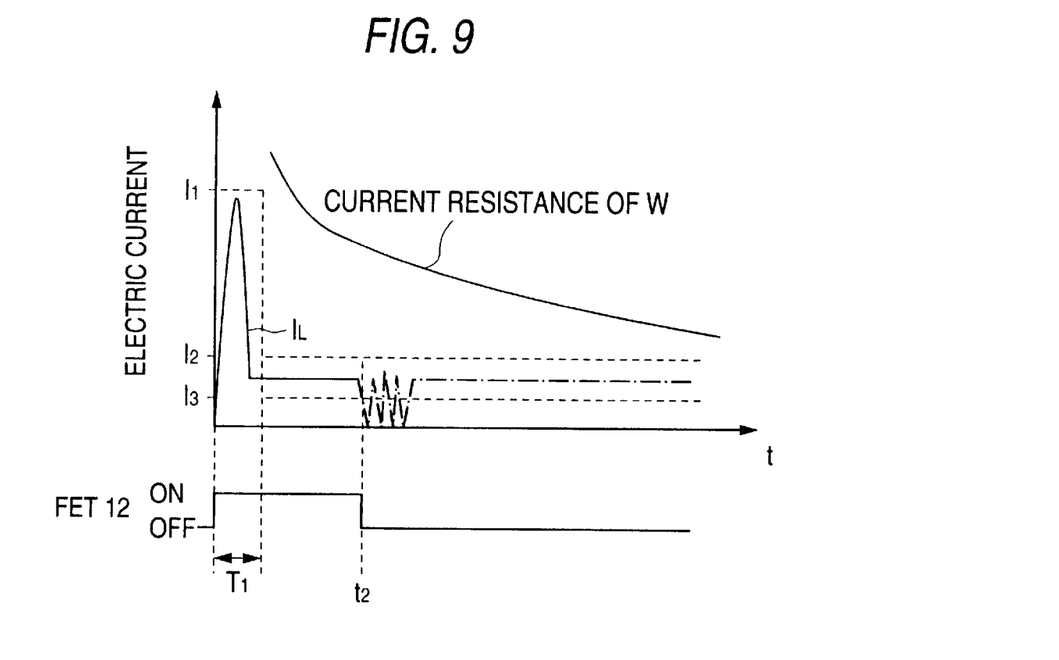
FIG. 9 is a graph showing another example of the abnormal state.

Referring to FIGS. 7 to 9, the operation of the third embodiment will now be described. FIG. 7 is a flow chart of a procedure for determining an excess current employed in the third embodiment. FIGS. 8 and 9 are diagrams respectively showing examples of the abnormal rate.

When the FET 12 has been turned on in response to a signal instructing the lamp L to be turned on and thus the lamp L has been turned on, the routine according to this embodiment is commenced. Thus, counting of time lapse T is commenced (step S200). Then, whether or not the set time $T_1$ has elapsed is determined (step S210). If the time has not elapsed (YES in step S210), the load electric current $I_L$ is sampled from the A/D converter 16 (step S220).

Then, the sampled load electric current $I_L$ is subjected to a comparison with the reference electric current $I_1$ to determine whether or not the load electric current $I_L$ is smaller than the reference electric current $I_1$ (step S230). If $I_L < I_1$ (YES in step S230), the operation returns to step S210. If $I_L \geq I_1$ (NO in step S230), the load electric current is determined to be an excess current. Thus, the FET 12 is turned off (step S240) and a status signal 18 output (step S250). Then, the foregoing routine is ended.

If $T \geq T_1$ in step S210, that is, if the set time $T_1$ has elapsed from time at which the lamp L has been turned on (NO in step S210), counting of the time lapse T is interrupted (step S260). Then, the load electric current $I_L$ is sampled (step S270) so that the sampled load electric current $I_L$ is subjected to a comparison with the reference electric currents $I_2$ and $I_3$ to compare their levels (step S280). If $I_3 < I_L < I_2$ (YES in step S280), the operation returns to step S270.

If $I_L \geq I_2$ or $I_L \leq I_3$ in step S280 (NO in step S280), a determination is made that the electric current is an excess current or in an abnormal state and the operation proceeds to step S240.

If an abnormal state as shown in FIG. 8 has been determined by the above-mentioned procedure, the FET 12 is turned off at time $t_1$ at which the load electric current $I_L$ is larger than the reference electric current $I_2$ after set time $T_1$ has elapsed from time at which the FET 12 has been turned on so that supply of electric power to the lamp L is interrupted.

If a fuse having a malting characterintic indicated by a two-dot chain line as shown in the drawing is provided in an abnormal case in which short circuit states are intermittently realized in place of a complete short circuit, the fuse is not melted because rise in the temperature takes place slowly and thus supply of electric power cannot be interrupted. However, the above-mentioned third embodiment is able to reliably interrupt supply of electric power. As a result, there is not apprehension of arc discharge occurring in the abnormal portion so that the electric line W and the lamp L are reliably protected.

If an abnormal state as shown in FIG. 9 takes place, the is FET 12 is turned off at time $t_2$ at which the load electric current $I_L$ is the reference electric current $I_3$ or lower after time lapse $T_1$ from time at which the FET 12 has been turned on. Thus, supply of electric power to the lamp L is interrupted.

If an abnormal state is realized in which an opened state is realized intermittently, the fuse is not melted because the electric current is not an excess eurrent. Therefore, supply of electric power cannot be interrupted. However, the third embodiment arranged to determine occurrence of an abnormal state is able to interrupt supply of electric power. As a result, the apprehension of arc discharge or the like occurring in the abnormal portion can be eliminated. Thus, the electric line W and the lamp L can reliably be protected.

An alternate long and short dash line shown in FIGS. 8 and 9 and drawn from time $t_1$ and $t_2$ indicate abnormal states in a case where electric power is not supplied to the lamp L because of the structure according to this embodiment.

Figure 10:
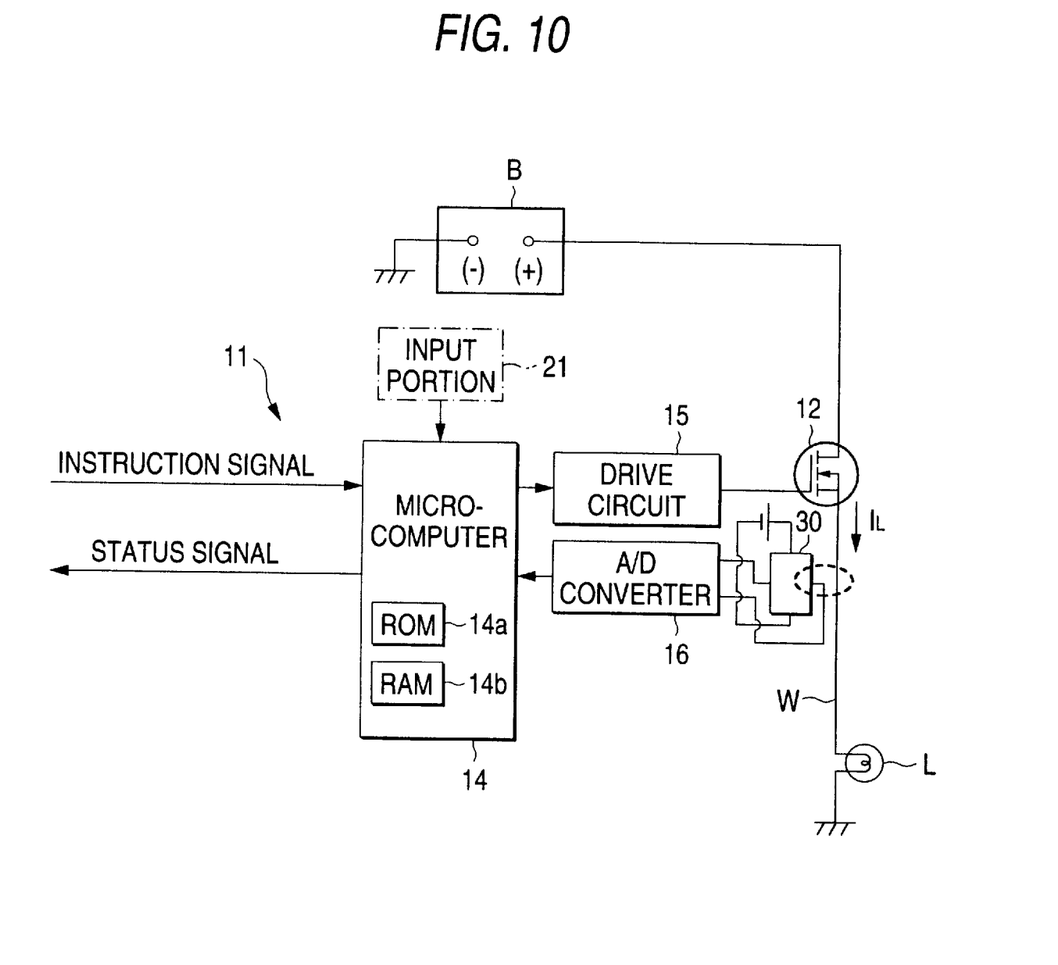
FIG. 10 is a circuit block diagram showing a fourth embodiment of the switch circuit having an excess-current detection function according to the present invention.

FIG. 10 is a circuit block diagram showing a fourth embodiment of the switch circuit having an excess-current detection function according to the present invention. The same elements as those according to the third embodiment are given the same reference numerals and the same elements are omitted from description.

The fourth embodiment is arranged in such a manner that a hall sensor (a current detection portion) 30 is provided as an iS alternative to the shunt resistor 13 according to the third embodiment.

The hall sensor 30 uses a hall effect which outputs voltage V which is in proportion to the product I×B of the magnetic flux density B of a magnetic field and electric current I which flows in the semiconductor device when the semiconductor device is placed in a magnetic field having the magnetic flux density B. In accordance with the known electric current I which is determined by the voltage of the battery and the output voltage V which is detected by the microcomputer 14, the magnetic flux density B can be obtained. Thus, load electric current $I_L$ which is in proportion to the magnetic flux density B can be obtained. The hall sensor 30 enables the load electric current $I_L$ to accurately be detected though the size of the apparatus ia very small.

The fourth embodiment, having the structure that the microcomputer 14 has a function similar to that of the third embodiment, attains a similar effect.

Figure 11:
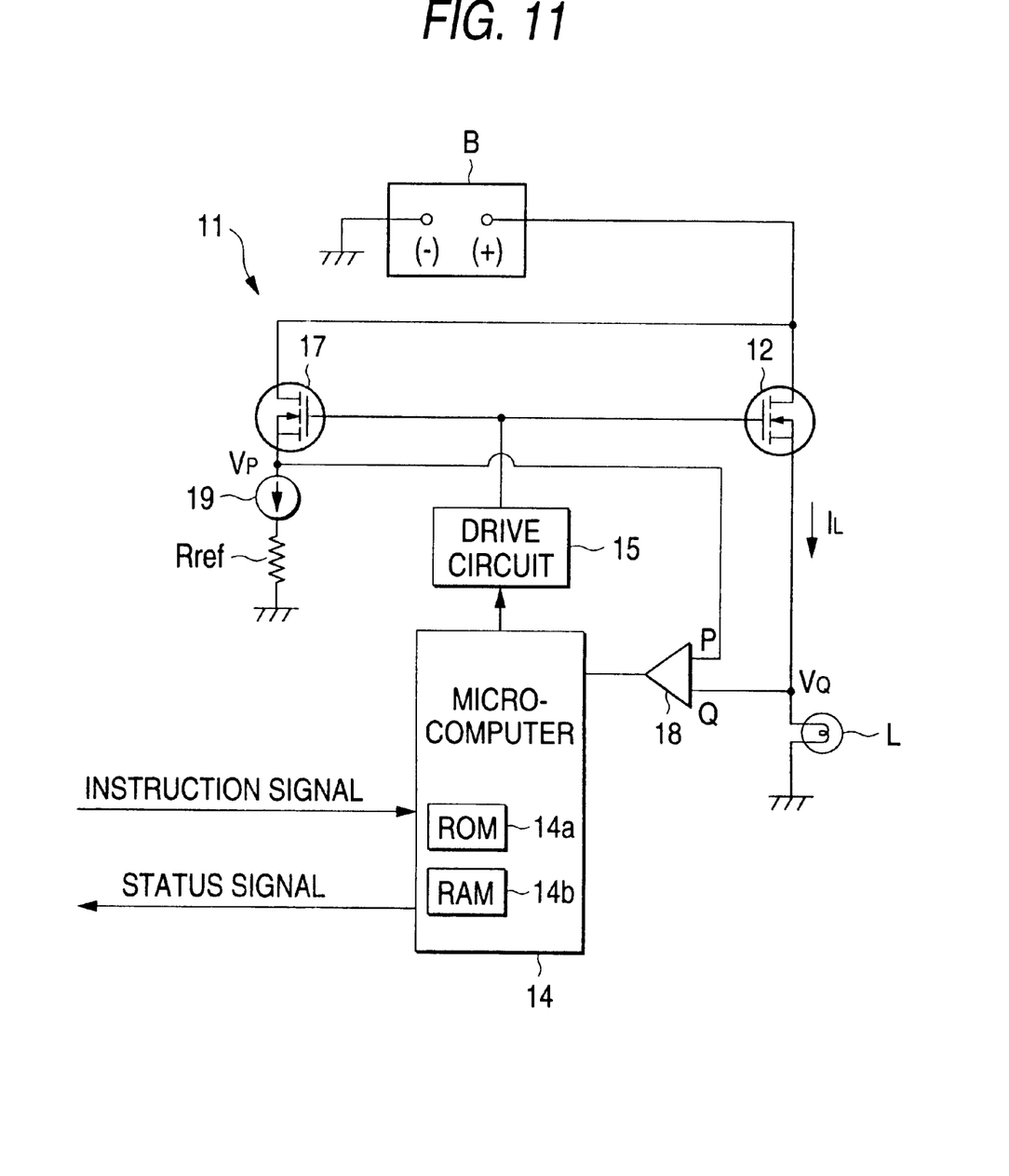
FIG. 11 is a circuit block diagram showing a fifth embodiment of the switch circuit having an excess-current detection function according to the present invention.

FIG. 11 is a circuit block diagram showing a fifth embodiment of the switch circuit having an excess-current detection function according to the present invention. The same elements as those according to the third embodiment are given the same reference numerals and the same elements are omitted from description.

The fifth embodiment is arranged to comprise an FET 17, a comparator 18, a constant-current circuit 19 and a reference resistor Rref in place of the shunt resistor 13 and the A/D converter 16 according to the third embodiment, the FET 12 being directly connected to the lamp L through the electric line W.

The drain of the FET 17 is connected to the positive terminal of the battery B, the gate of the same is connected to the gate of the FET 12 and the source is connected to the input side of the constant-current circuit 19 and connected to input terminal P of the comparator 18.

Another input terminal Q of the comparator 18 is connected to the source of the FET 12, while the output terminal is connected to an input terminal of the microcomputer 14.

The comparator 18 subjects input voltages $V_P$ and $V_Q$ to the input terminals P and Q to a comparison. When $V_P \geq V_Q$, the comparator 18 outputs a low-level signal and outputs a high-level signal when $V_P < V_Q$. The output side of the constant-current circuit 19 is grounded through the reference resistor Rref.

Assuming that the on-resistance of the FET 12 and 17 are $R_{DS(on)12}$ and $R_{DS(on)17}$ respectively, the employed FET 17 satisfies $R_{DS(on)12} < R_{DS(on)17}$. The foregoing requirement can be met by employing an FET having cells by the number smaller than the cells of the FET 12. The difference in the on-resistance, a large electric current can be supplied to the FET 12, that is, the lamp L as compared with the FET 17.

The foregoing circuit causes a predetermined electric current to be supplied to the reference resistance Rref by the constant-current circuit 19. Therefore, the voltage $V_P$ has a constant value. Therefore, when the load electric current $I_L$ satisfies $I_L = I_2$, the value $V_{Q2}$ of the voltage $V_Q$ is caused to satisfy $V_{Q2} = V_P$ by setting the resistance value of the reference resistor Rref.

When a high-level signal has been supplied from the comparator 18 to the microcomputer 14 because $V_P < V_Q$ has been satisfied, the microcomputer 14 determines that the load current is an excess current.

The fifth embodiment is arranged in such a manner that the load electric current $I_L$ is not directly detected. As an alternative to this, the two-end voltage $V_Q$ of the lamp L in employed. Therefore, when the characteristics of the lamp L satisfy $V_P < V_Q$ during passage of the rush current, the microcomputer 14 does not determine the level of the input signal from the comparator 18 until the set time $T_1$ elapses. The determination may be commenced after the set time $T_1$ has elapsed.

The reason why a rush current flows lies in that the resistance value of the lamp L is low. Therefore, when $V_P < V_Q$ cannot be satisfied until the set time $T_1$ elapses attributable to the characteristics of the lamp L, the microcomputer 14 does not count the time lapse T and may always determine the level of the input signal from the comparator 18.

The fifth embodiment structured in such a manner that the two-end voltage $V_Q$ of the lamp L is subject to a comparison with the predetermined voltage $V_P$ to make a comparison between the load current $I_L$ and the reference electric current $I_2$ so as to determine that the electric current is an excess current when $V_P < V_Q$. Thus, an effect similar to that obtainable from the third embodiment can be attained even if an abnormal state as shown in FIG. 8 takes place.

The present invention is not limited to the third to fifth embodiments. The following modifications (11) to (14) may be employed.

(11) The structure according to the third embodiment or the fourth embodiment may be arranged in such a manner that an input portion 21 comprising a dip switch is provided as 25 indicated by an alternate long and short dash line shown in FIGS. 6 and 10 and the microcomputer 14 is permitted to arbitrarily determine the values of reference electric currents $I_1$, $I_2$ and $I_3$ in accordance with the input to the input portion 21.

(12) Although the third to fifth embodiments have the structure in which the N-channel field-effect transistor to serve as the semiconductor switching device, a bipolar transistor, a P-channel FET or an insulation gate type bipolar transistor (IGBT), may be employed.

(13) The third to fifth embodiments may be arranged in such a manner that notifying means comprising an LCD panel or the like for communicating interruption of supply of electric power attributable to an excess current to a user in accordance with a status signal output from the switch circuit 11 having an excess-current detection function to the outside is attached to is an appropriate position on the outside of the switch circuit 11 having an excess-current detection function. As a result, interruption of supply of electric power attributable to an excess current can reliably be notified to a user.

(14) Although the third to fifth embodiments have been described to have a structure in which the present invention is applied to the switch circuit for controlling the lamp L which in the load, the present invention is not limited to this. The present invention may be applied to a load having a large rush current, such as a motor or a large-capacity capacitor.

The load may be a load which does not generate any rush current. In this case, counting of the lapse time T and comparison of the reference electric current $I_1$ and the load electric current $I_L$ are not required.

As described above, the present invention has the structure that a load electric current which flows in a load is detected. If the detected load electric current satisfied the excess current determining condition determined previously in accordance with the electric characteristics of the electric line between the load and the power source or those of the load, on-off control of the semiconductor switching device is changed. Therefore, supply of electric power exceeding the electric characteristics of the electric line or the load can be prevented. As a result, the electric line and the load can be protected from the excess current.

Since the semiconductor switching device, the switch control means and the excess-current control means are integrally formed on a substrate, the size of the circuit can be reduced and the electrical wiring can be simplified.

Since the electric-current detection means is furthermore integrally formed on the substrate, the size reduction and simplification of the electrical wiring can furthermore be enhanced.

The energizing timer in which a load electric current higher than a reference electric current level flows and the load electric current are used to set the excess current determining condition so that a problem in that the energizing time of the excess current exceeds the electric characteristics of the electric line and those of the load is reliably prevented. As a result, the electric lines and the load can reliably be protected.

A load electric current, which flows in the load, is detected, and the detected load electric current, a reference electric current and a plurality of set electric currents are subject to a comparison. A plurality of excess current determining conditions arranged in such a manner that the set time is made to be short as the set electric current is high are used to determine an excess current. Thus, the determination of the excess current can precisely be performed. As a result, supply of electric power exceeding the electric characteristics of the electric line or those of the load can reliably be prevented.

A load electric current, which flows in the load, is detected. If the detected load electric current satisfies a excess current determining condition determined previously in accordance with the electric characteristics of the electric line between the load and the power source or those of the load, the semiconductor switching device is switched off. Thus, supply of an excess current larger than the electric characteristics of the electric line between the load and the power source or those of the load can be prevented.

The reference electric current determined previously in accordance with the electric characteristics of the electric line between the load and the power source or those of the load and the detected load electric current are subjected to a comparison. Then, a determination is performed that the electric current is an excess current when the load electric current is larger than the reference electric current. Thus, in an intermittent short circuit state which is not a complete short circuit state, the semiconductor switching device is switched off to reliably prevent supply of an electric current larger than the electric characteristics of the electric line between the load and the power source or those of the load.

The lapse of time from the time at which the semiconductor switching device has been switched on is counted. When the load electric current is larger than the high-level reference electric current, the current is determined to be an excess current after a predetermined set time elapses from the time at which the semiconductor switching device has been switched on. After the set time has elapsed from the time at which the semiconductor switching device has been switched on, a determination is made that the current is an excess current if the load electric current is larger than the reference electric current. As a result, even with a load, in which a rush current flows when it is turned on, the rush current is not erroneously determined to be an excess current.

After the set time has elapsed from the time at which the semiconductor switching device has been switched on, a determination is performed that the load electric current is abnormal even if the load electric current is smaller than the low-level reference electric current. Therefore, even if an abnormal state is realized in which intermittent opening takes place, the semiconductor switching device is switched off. Thus, supply of electric power in an abnormal state can reliably be prevented.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A switch circuit having an excess-current detection function, comprising:
    a semiconductor switching device disposed between a load and a power source and arranged to turn on or off the connection between said load and said power source in accordance with a control signal supplied to a control terminal thereof;
    switch control means arranged to receive an instruction signal output from an instruction-signal output portion and to output the control signal to said control terminal of said semiconductor switching device so as to control supply of electric power from said power source to said load;
    electric-current detection means for detecting a load electric current which flows in said load;
    excess-current control means for changing on/off control of said semiconductor switching device when detection of said load electric current satisfies at least one of a plurality of an excess current determining conditions previously determined in accordance with the electric characteristics of an electric line between said load and said power source, or electric characteristics of said load; and
    an A/D converter connected with said electric-current detection means for converting the detected load electric current from an analog value to a digital value,
        wherein said excess-current control means has comparison means for subjecting said digital value of said detected load electric current and a reference electric current determined previously in accordance with the electric characteristics to a comparison, to determine an excess current, said excess current being a load electric current that is greater than said reference electric current and count means for counting energizing time in which said excess current flows in said load, and said excess current determining condition is determined by using said excess current and said energizing time; and
        wherein said excess-current control means is arranged to determine the excess current when a condition is satisfied such that a predetermined electric current larger than said reference electric current flows in said load for time determined previously in accordance with said electric characteristics and provided with said plurality of excess current determining conditions obtained by combining different set electric currents and set time periods arranged in such a manner that the set time is shortened in inverse proportion to the set electric current, said comparison means further subjects said digital value of said detected load electric current and each of said set electric currents to a comparison, and said count means further counts energizing time in which an electric current larger than each of said set electric currents flow in said load.

2. A switch circuit having an excess-current detection function according to claim 1, wherein said semiconductor switching device, said switch control means and said excess-current control means are integrally formed on a substrate.

3. A switch circuit having an excess-current detection function according to claim 2, wherein said electric-current detection means is furthermore integrally formed on said substrate.

4. A switch circuit having an excess-current detection function according to claim 1, wherein a storage means included in the excess-current control means stores a high-level reference electric current higher than said reference electric current and a predetermined set time, and said excess-current control means is further provided with count means for counting a lapse of time from time at which said semiconductor switching device has been switched on by said switch control means to determine an excess current when said digital value of said detected load electric current is larger than said high-level reference electric current in a state where said lapse of time is shorter then said set time and to determine an excess current when said digital value of said detected load electric current is larger than said reference electric current in a state where said lapse of time is longer than said set time.

5. A switch circuit having an excess-current detection function according to claim 4, wherein said storage means further stores a low-level reference electric current smaller than said reference electric current and said excess-current control means further determines abnormality when said digital value of detected load electric current is smaller than said low-level reference electric current in a state where said lapse of time is longer than said set time.

6. A switch circuit having an excess-current detection function, comprising:
   a semiconductor switching device disposed between a load and a power source and arranged to turn on or off the connection between said load and said power source in accordance with a control signal supplied to a control terminal thereof;
   switch control means arranged to receive an instruction signal output from an instruction-signal output portion and to output the control signal to said control terminal of said semiconductor switching device so as to control supply of electric power from said power source to said load;
   electric-current detection means for detecting a load electric current which flows in said load;
   excess-current control means for changing on/off control of said semiconductor switching device when detection of said load electric current satisfies an excess current determining condition previously determined in accordance with the electric characteristics of an electric line between said load and said power source, or electric characteristics of said load; and
   an A/D converter which converts the detected load electric current from an analog value to a digital value so as to supply said digital value to said excess-current control means,
   wherein said excess-current control means turns said semiconductor switching device off when said excess current determining condition is satisfied,
   wherein said excess-current control means includes storage means for storing a reference electric current determined previously in accordance with the electric characteristics, and comparison means for subjecting said digital value of said detected load electric current and said reference electric current to a comparison to determine an excess current when said digital value of said detected load electric current is larger than said reference electric current, and
   wherein said storage means further stores a high-level reference electric current higher than said reference electric current and a predetermined set time, and said excess-current control means is further provided with count means for counting a lapse of time from time at which said semiconductor switching device has been switched on by said switch control means to determine an excess current when said digital value of said detected load electric current is larger than said high-level reference electric current in a state where said lapse of time is shorter than said set time and to determine an excess current when said digital value of said detected load electric current is larger than said reference electric current in a state where said lapse of time is longer than said set time.

* * * * *